(12) United States Patent
Kahlman et al.

(10) Patent No.: US 12,389,506 B2
(45) Date of Patent: Aug. 12, 2025

(54) LIGHT EMITTING DIODE, LED, DRIVER ARRANGED FOR DRIVING AT LEAST ONE LED, AS WELL AS A CORRESPONDING LED BASED LIGHTING DEVICE, INTEGRATED CIRCUIT, IC, AND METHOD

(71) Applicant: SIGNIFY HOLDING B.V., Eindhoven (NL)

(72) Inventors: Henricus Marius Joseph Maria Kahlman, Dongen (NL); Theo Gerrit Zijlman, Tilburg (NL); Bertrand Johan Edward Hontele, Breda (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 138 days.

(21) Appl. No.: 18/017,901

(22) PCT Filed: Jul. 16, 2021

(86) PCT No.: PCT/EP2021/070040
§ 371 (c)(1),
(2) Date: Jan. 25, 2023

(87) PCT Pub. No.: WO2022/023088
PCT Pub. Date: Feb. 3, 2022

(65) Prior Publication Data
US 2023/0319961 A1 Oct. 5, 2023

(30) Foreign Application Priority Data

Jul. 30, 2020 (EP) ...................................... 20188753

(51) Int. Cl.
*H05B 45/30* (2020.01)
*G01R 19/165* (2006.01)
(Continued)

(52) U.S. Cl.
CPC ...... *H05B 45/347* (2020.01); *G01R 19/16566* (2013.01); *H03K 5/086* (2013.01); *H05B 45/395* (2020.01)

(58) Field of Classification Search
CPC ...... H05B 45/30; H05B 45/34; H05B 45/345; H05B 45/347; H05B 45/395; H03K 5/08;
(Continued)

(56) References Cited

U.S. PATENT DOCUMENTS 10,051,699 B1 * 8/2018 Park .................. H05B 45/3725
11,540,372 B2 * 12/2022 Huang .................. H05B 45/40
(Continued)

FOREIGN PATENT DOCUMENTS

CN 109348587 A 2/2019
DE 102011088407 A1 6/2013
(Continued)

*Primary Examiner* — Long Nguyen

(57) ABSTRACT

A Light Emitting Diode, LED, driver arranged for driving at least one LED, said LED driver comprising a rectifier arranged for receiving an Alternating Current, AC, supply voltage and for providing an output Direct Current, DC, voltage to said at least one LED, a voltage regulating branch arranged for controlling an LED voltage provided to said at least one LED, via a supply line, wherein said voltage regulating branch is arranged for receiving said DC voltage from said rectifier, wherein said voltage regulating branch comprises, a capacitor arranged for providing said LED voltage to said at least one LED, a current limiter, connected in series with said capacitor, and arranged for charging said capacitor thereby providing said LED voltage and a feedback circuit arranged for controlling the charging of said capacitor by said current limiter, and thereby controlling the LED voltage provided to said at least one LED, by regulating a minimum residual headroom voltage present on a LED current limiter coupled in series with said at least one LED.

7 Claims, 3 Drawing Sheets

(51) Int. Cl.
*H03K 5/08* (2006.01)
*H05B 45/347* (2020.01)
*H05B 45/395* (2020.01)

(58) Field of Classification Search
CPC ........ H03K 5/082; H03K 5/084; H03K 5/086; H03K 5/1532; G01R 19/165; G01R 19/16566; H02M 1/42
See application file for complete search history.

(56) References Cited

U.S. PATENT DOCUMENTS

| | | |
|---|---|---|
| 2013/0278157 A1 | 10/2013 | Radermacher |
| 2014/0265892 A1 | 9/2014 | Chang et al. |
| 2019/0191506 A1 | 6/2019 | Huang et al. |

FOREIGN PATENT DOCUMENTS

| | | |
|---|---|---|
| JP | 2014011466 A | 1/2014 |
| TW | M496315 U | 2/2015 |

* cited by examiner

LIGHT EMITTING DIODE, LED, DRIVER ARRANGED FOR DRIVING AT LEAST ONE LED, AS WELL AS A CORRESPONDING LED BASED LIGHTING DEVICE, INTEGRATED CIRCUIT, IC, AND METHOD

CROSS-REFERENCE TO PRIOR APPLICATIONS

This application is the U.S. National Phase application under 35 U.S.C. § 371 of International Application No. PCT/EP2021/070040, filed on Jul. 16, 2021, which claims the benefit of European Patent Application No. 20188753.6, filed on Jul. 30, 2020. These applications are hereby incorporated by reference herein.

FIELD OF THE INVENTION

The present invention generally relates to the field of lighting and, more specifically, to Light Emitting Diode, LED, drivers that are arranged to convert an Alternating Current, AC, voltage supply to a Direct Current, DC, voltage for driving at least one LED.

BACKGROUND OF THE INVENTION

Direct mains linear Light Emitting Diode, LED, drivers are known in the art. These type of drivers are directly connected to the Alternating Current, AC, mains supply voltage. The AC mains supply voltage is rectified by utilizing, for example, a full wave rectifier.

The rectified voltage is then further peak rectified by a capacitor, and fed to the LEDs. The charge current of this capacitor is controlled by a current limiter. The current limiter has a fixed amplitude such that the width of the charge current, and thus also the mains input current, is enlarged in order to meet regulatory guidelines like the IEC 61000-3-2.

Losses in the direct mains linear LED driver may, at least for a part, be contributed to the LED current limiter that is placed in series with the LEDs. The voltage over the LED current limiter, and thus also the accompanying loss, is linear proportional to the AC supply voltage and the forward voltages of the LEDs.

Typically, these drivers are operated in a tuning point which corresponds to the situation having the lowest mains supply voltage and highest forward voltage drop of the LEDs. In this situation, the loss in the LED current limiter will linearly increase above the tuning point resulting in a rather small operating window.

Following the above, there is a need for a Light Emitting Diode, LED, driver that has reduced losses compared to the above described known LED driver.

SUMMARY

It would be advantageous to achieve a Light Emitting Diode, LED, driver arranged for driving at least one LED, which driver has reduced losses compared to the above described known LED driver.

It would further be advantageous to achieve a corresponding LED based lighting device, method of operating an LED driver and an Integrated Circuit, IC.

The above mentioned and other objects are achieved in a first aspect of the present disclosure, by a Light Emitting Diode, LED, driver arranged for driving at least one LED. The LED driver comprising:

a rectifier arranged for receiving an Alternating Current, AC, supply voltage and for providing an output Direct Current, DC, voltage to said at least one LED;

a voltage regulating branch arranged for controlling an LED voltage provided to said at least one LED, via a supply line, wherein said voltage regulating branch is arranged for receiving said DC voltage from said rectifier, wherein said voltage regulating branch comprises:

a capacitor arranged for providing said LED voltage to said at least one LED;

a current limiter, connected in series with said capacitor, and arranged for charging said capacitor thereby providing said LED voltage;

an LED current limiter, connected in series with said at least one LED, such that said residual headroom voltage is present over said LED current limiter; and a feedback circuit comprising a comparator block arranged for providing an output based on a potential difference between two input terminals of said comparator block, wherein a first of said two input terminals is set to a predefined residual headroom voltage, and wherein a second of said two input terminals is arranged for receiving a value of said residual headroom voltage present on said LED current limiter of said at least one LED, and wherein an output of said comparator block is used for controlling said current limiter, wherein the feedback circuit is arranged for controlling the charging of said capacitor by said current limiter, and thereby controlling the LED voltage provided to said at least one LED, by regulating a residual headroom voltage present on the LED current limiter.

The inventors have found that it may be beneficial to couple the charging of the capacitor to the measured residual headroom voltage which is present on an LED current limiter coupled in series with the at least one LED. This is accomplished by the voltage regulating branch. The voltage regulating branch may thus be arranged to control the current limiter based on the minimum residual headroom voltage present on the LED current limiter.

More specifically, the LED driver in accordance with the present disclosure may be arranged to substantially stabilize the minimum residual headroom voltage to a predefined value, independent of the actual mains voltage and the forward voltages of the LED's.

This means that the headroom voltage may follow the same cycle as the mains supply voltage, but that the minimum headroom voltage is controlled to a particular value. The minimum headroom voltage may be defined as the minimum voltage present on the LED current limiter during one mains cycle.

One of the advantages of the LED driver in accordance with the present disclosure is that the LED driver is independent from the actual LEDs that are being used, and thus also independent of the actual forward voltages of the LED's. Another advantage is that the LEDs may have a temperature dependent coefficient, which is also compensated by the LED driver in accordance with the present disclosure.

Following the above, it is no longer needed to "set" the charging current of the current limiter to a predefined value, or a predefined charging current, wherein the current limiter was usually set in such a way that it was optimized for the lowest voltage of the mains supply and the maximum forward voltages of the LEDs. This was the worst case scenario that had to be taken into account to assure a correct operating LED driver.

The present LED driver does not need to be tailored to such a specific point (i.e. lowest voltage of the mains supply and maximum forward voltages of the LEDs), as the voltage regulating branch will assure that the current limiter is controlled adequately, i.e. to assure a particular minimum headroom voltage at the LED current limiter.

It is noted that the charging current of the capacitor, i.e. the current that is controlled by the current limiter, may not be constant over time. This charging current may be modulated and may have a dependency with the actual rectified AC mains supply voltage. This is explained in more detail with respect to the figures.

The voltage provided by the capacitor is provided to the anode of the at least one LED. The voltage present on the LED current limiter may be equal to the voltage at the cathode of the at least one LED. This may thus be considered as the residual voltage that is left over when the forward voltages of the at least one LED is subtracted from the voltage provided by the capacitor.

It is noted that a current limiter may be implemented in a variety of ways. A current limiter may be implemented as a circuit having one or more transistors or Field Effect Transistors, FET's, in combination with one or more resistors.

In an example, the LED driver comprises said at least one LED, and further comprises:
 an LED current limiter, connected in series with said at least one LED, such that said residual headroom voltage is present over said LED current limiter.

It is noted that the LED current limiter may be implemented as a resistor, a linear current regulator or anything alike.

In a further example, the feedback circuit comprises:
 a comparator block arranged for providing an output based on a potential difference between two input terminals of said comparator block, wherein a first of said two input terminals is set to a predefined minimum residual headroom voltage, and wherein a second of said two input terminals is arranged for receiving a minimum value of said residual headroom voltage present on said LED current limiter of said at least one LED, and wherein an output of said comparator block is used for controlling said current limiter.

It is noted that the feedback circuit is arranged for controlling the charging of said capacitor by said current limiter. Initially, the feedback circuit may be set in such a way that the charge current of the current limiter is initially set too high. This prevents that the normal or regular operation of the LED driver is compromised.

This may have the effect that the losses of the LED driver may be too high initially. The losses are then reduced as the feedback circuit is arranged to regulate the minimum headroom voltage to a predefined voltage. This thus also means that, initially, the minimum headroom voltage is most likely too high and that the minimum headroom voltage is gradually controlled to a predefined minimum voltage.

It is noted that different kind of control mechanisms are possible for the feedback circuit, for example a PI control, PID control, or anything alike.

In another example, wherein the feedback circuit further comprises:
 a minimum voltage detector block, for providing an output based on a potential difference between two input terminals of said second minimum voltage detector block, wherein a first of said two input terminals is set to a predefined minimum voltage, and wherein a second of said two input terminals is connected to said LED current limiter, which is coupled in series with said at least one LED, wherein said output of said minimum voltage detector block is connected to said second of said two input terminals of said comparator block.

The predefined minimum voltage may be set using a separate capacitor, wherein the separate capacitor is charged to the minimum voltage level present on the LED current limiter.

In an example, the predefined minimum residual headroom voltage is approximately 1 Volt.

In a further example, the LED driver comprises a plurality of in parallel connected LED branches, each LED branch comprising:
 at least one LED; and
 an LED current limiter connected in series with the at least one LED, such that a plurality of residual headroom voltages are present over said LED current limiters, wherein said feedback circuit is arranged for controlling the charging of said capacitor by said current limiter, and thereby controlling the LED voltage provided to said at least one LED of each LED branch, by regulating a minimum residual headroom voltage present over any of said LED current limiters.

The above provided example describes a situation in which the LED driver is arranged to power multiple parallel LED branches, wherein each LED branch is associated with its own LED current limiter. Each of the LED current limiters is then associated with a particular residual headroom voltage, which may or may not be equal to each other. The presented LED driver may then be arranged to regulate the lowest of the each of residual headroom voltages, such that the minimum residual headroom voltage equals the minimum residual headroom voltage of the lowest one.

In a second aspect of the present disclosure, there is provided a Light Emitting Diode, LED, based lighting device comprising:
 at least one LED for emitting light;
 An LED driver in accordance with any of the examples provided above.

It is noted that the advantages of the present disclosure related to the first aspect of the invention are also applicable for the second aspect of the invention, being the LED based lighting device.

The LED based lighting device may comprise a plurality of LEDs for example Warm White LEDs, Cool White LEDs or any type of color LEDs. The LED's may be connected in series, may have multiple branches or anything a like. In a specific example, the LEDs are divided into multiple branches, wherein each branch is directed to emit a particular color. In the latter, multiple LED current limiters may exist for assuring that a particular amount of current is flowing through the respective branches.

Multiple residual headroom voltages may exist in the scenario where there a multiple branches, i.e. over each of the LED current limiters. In such a case, it may be decided to control the charging current of the current limiter based on the residual headroom voltage that is the lowest. That is, the headroom voltage which has the absolute minimum headroom voltage when compared to each other.

In a third aspect, there is provided a method of operating an LED driver in accordance with any of the examples provided above, wherein said method comprises the step of:
 controlling, by said voltage regulating branch, the LED voltage provided to said at least one LED by regulating the minimum residual headroom voltage present on an LED current limiter coupled in series with said at least one LED.

In an example, the step of regulating further comprises:
regulating, by said voltage regulating branch, the LED voltage provided to said at least one LED by stabilizing the minimum residual headroom voltage to a pre-defined minimum residual headroom voltage.

In a further example, the method further comprises the step of:
controlling, by said feedback circuit, the current limiter (G) based on an amplified difference between the residual headroom voltage present on the LED current limiter and a predefined residual headroom voltage.

In yet a further example, the predefined residual headroom voltage is approximately 1 Volt.

In a fourth aspect of the present disclosure, there is provided an Integrated Circuit, IC, arranged for performing a method in accordance with any of the examples provided above.

These and other aspects of the inventions will be apparent from and elucidated with reference to the embodiment(s) described hereinafter.

DETAILED DESCRIPTION

Figure 1:
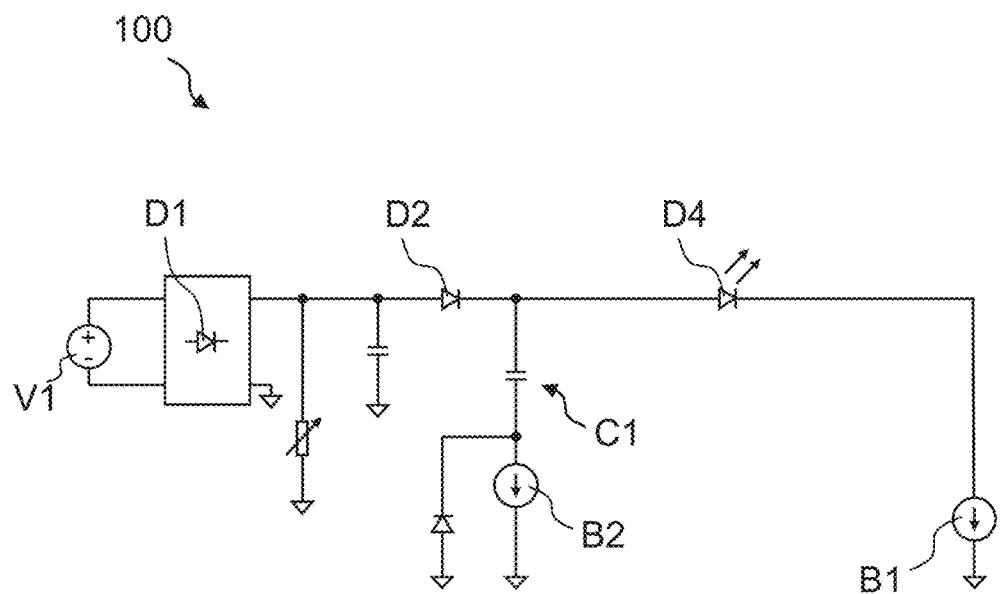
FIG. 1 discloses a functional block diagram of a typical direct mains linear LED driver in accordance with the prior art.

The drawings are only schematic and are non-limiting. In the drawings, the size of some of the elements may be exaggerated and not drawn on scale for illustrative purposes.

FIG. 1 discloses a functional block diagram illustrating a typical direct mains linear LED driver 100 in accordance with the prior art.

The LED driver 100 is directly connected to the Alternating Current, AC, mains supply voltage V1. The mains supply voltage may be a 230 Vac or a 110 Vac voltage, or anything alike. The AC mains supply voltage is rectified by utilizing a full wave rectifier D1. A full wave rectifier is arranged to convert both halves of each cycle of the AC mains supply voltage into a pulsating Direct Current, DC, signal.

The DC signal is fed into a capacitor C1 via a diode D2. The capacitor C1 is arranged to provide a DC voltage to at least one LED D4.

It is noted that the capacitor C1 is charged using a linear current limiter B2 that is connected in series with the capacitor C1. It is noted that the charge current provided by the linear current limiter B2 is set once, and is tuned to a particular tuning point. The tuning point is determined for the lowest AC mains supply voltage and the maximum forward voltage of the at least one LED. That is a worst case scenario that is taken into account when determining the charge current of the current limiter B2.

The headroom voltage is present over the LED current limiter B1.

As mentioned before, losses in such a direct mains linear LED driver may, at least for a part, be contributed to the LED current limiter B1 that is placed in series with the at least one LED. The voltage over the LED current limiter B1, and thus also the accompanying loss, is linear proportional to the AC mains supply voltage and the forward voltages of the at least one LED. The losses are linear proportional to the AC mains supply voltage as the charge current of the capacitor is fixed.

It is further noted that the voltage over B1, i.e. the headroom voltage, is not static. The voltage over B1 will fluctuate in line with the fluctuations provided by the AC mains supply voltage.

In accordance with the present disclosure, the minimum residual headroom voltage may be defined as the minimum voltage over B1 over a particular AC mains supply voltage cycle.

Figure 2:
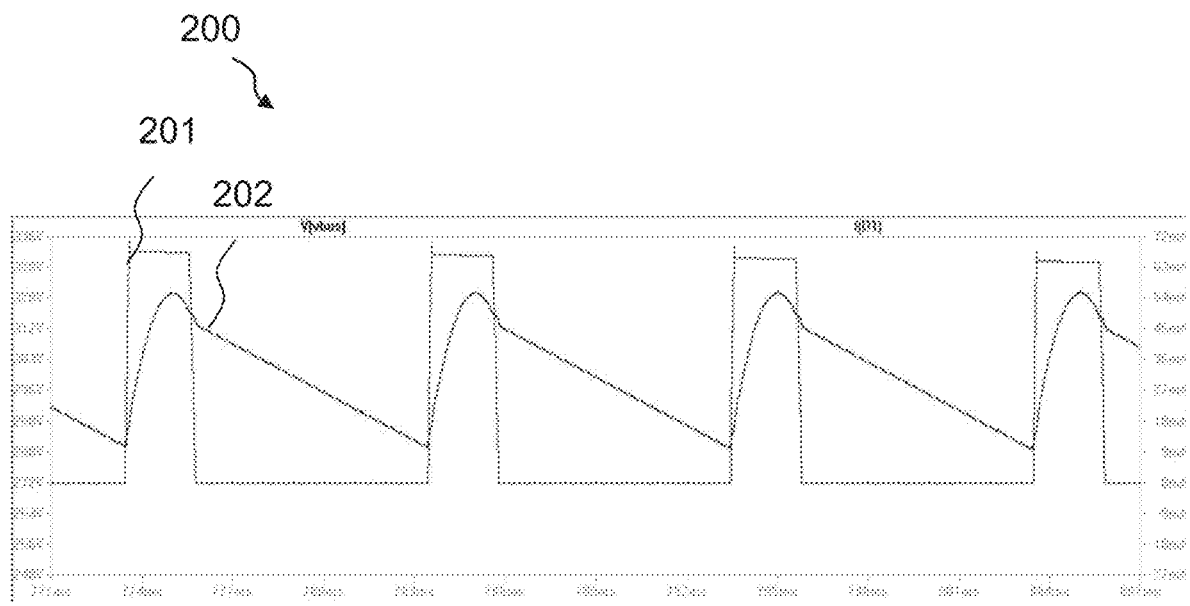
FIG. 2 discloses a graph illustrating the minimum residual headroom voltage using the typical direct mains linear LED driver in accordance with the prior art.

FIG. 2 discloses a graph 200 illustrating the minimum residual headroom voltage using the typical direct mains linear LED driver in accordance with the prior art as described above.

The line as indicated with reference numeral 201 illustrates the charging current of the capacitor, i.e. the current provided by the current limiter B2. The line as indicated with reference numeral 202 illustrates the voltage provided by the capacitor C1 to the at least one LED D4.

As shown in FIG. 2, the charging current is pulsating and fixed over time. The capacitor C1 is charged when the charging current is enabled. The charging current, in this particular example, is about 63 mA. The voltage provided by the capacitor C1 is increasing whenever the capacitor is being charged. The voltage provided by the capacitor C1 rises from about 282V to about 324V.

It is further shown that the voltage provided by the capacitor is linearly decreasing whenever there is no charging current present. This is caused by the static current provided by the LED current limiter.

In this particular example, the minimum residual headroom voltage may be determined by subtracting the forward voltage of the at least one LED from the 282V as disclosed in FIG. 2.

The presented LED driver is advantageous over the prior art as it may be able to improve the issue of decreased LED driver efficiency outside the tuning point by stabilizing the minimum residual headroom voltage to a pre-defined value, which may be independent of the AC mains supply voltage and the forward voltage of the at least one LED. The thermal load between the LED current limiter B1 and the charge current of the current limiter is also distributed more equally.

Figure 3:
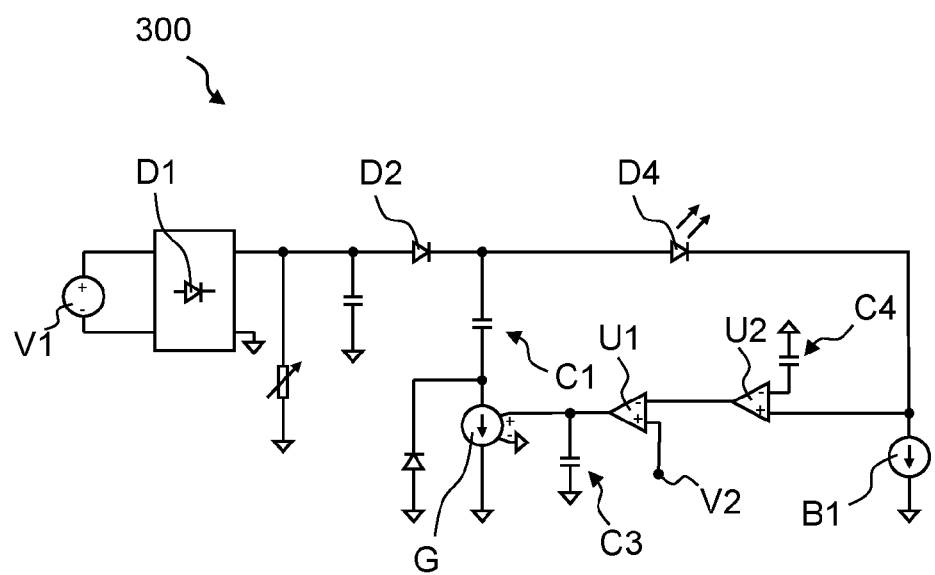
FIG. 3 discloses an LED driver in accordance with the present disclosure.
Figure 4:
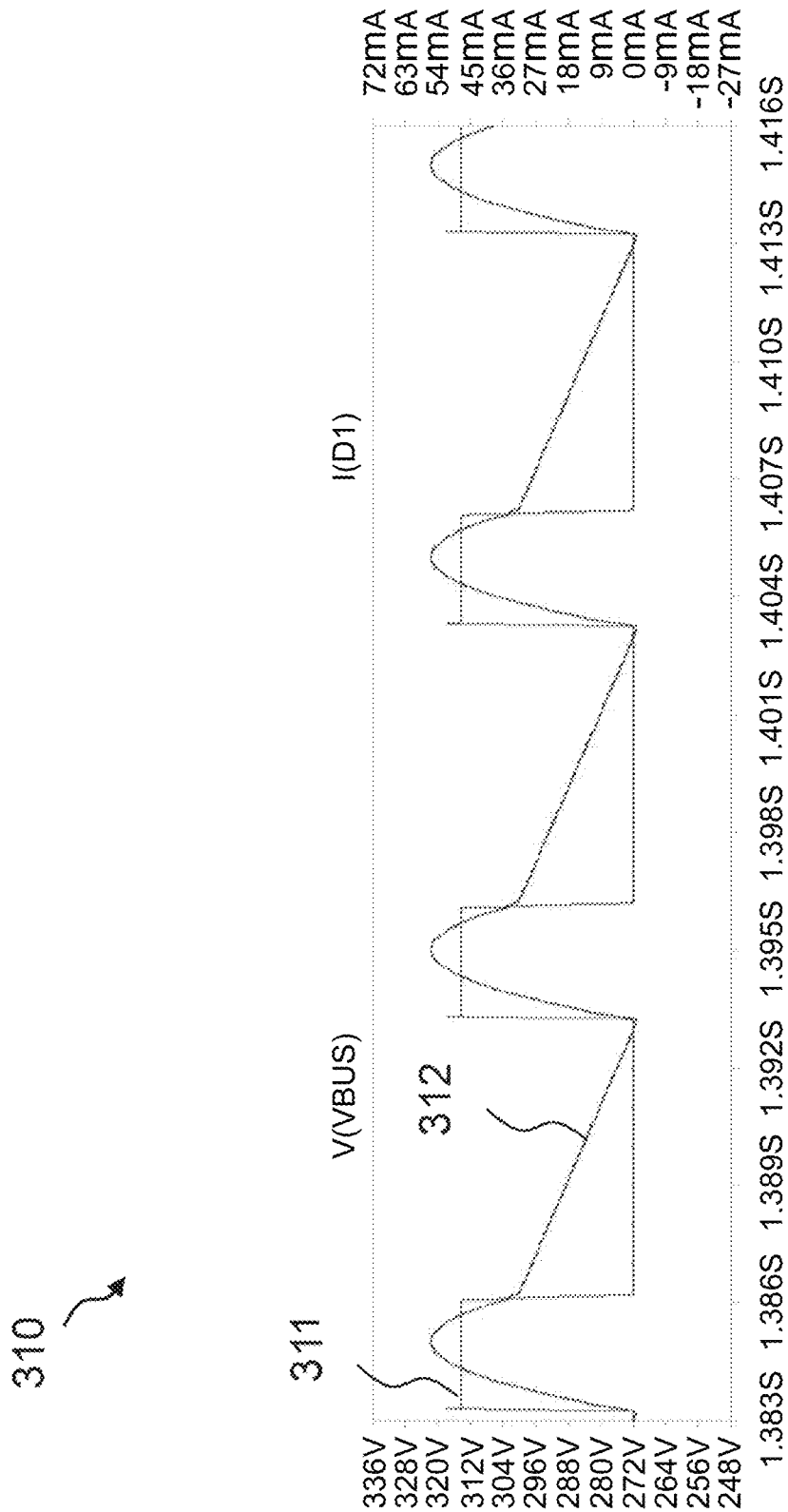
FIG. 4 discloses a graph illustrating the minimum residual headroom voltage using an LED driver in accordance with the present disclosure.

The above is explained in more detail with respect to FIGS. 3 and 4.

FIG. 3 discloses an LED driver 300 in accordance with the present disclosure.

One of the ideas of the present disclosure is to stabilize the minimum residual headroom voltage of the LED current limiter B1 by modulating the charge current of the capacitor C1 via a current limiter G.

The minimum residual headroom voltage may be defined as the minimum voltage across the LED current limiter B1 during one cycle of the AC mains supply voltage. In practice, the LED current limiter may need about 1V minimum headroom voltage to operate in the linear region and to regulate to the pre-set LED current that is required by the at least one LED's. However, any minimum headroom voltage may be set in accordance with the present disclosure.

The LED driver 300 shown in FIG. 3 has multiple new aspects that are elaborated in more detail here below.

The LED driver 300 comprises a voltage regulating branch arranged for controlling an LED voltage provided to said at least one LED, via a supply line, wherein said voltage regulating branch is arranged for receiving said DC voltage from said rectifier.

The supply line may be considered as the line between the capacitor C1 and the at least one LED D4.

The voltage regulating branch comprises the capacitor C1, the current limiter G and a feedback circuit.

The current limiter G is controllable in that the charging current of C1 may be set. The charging current may thus not be fixed, but may depend on a control signal that it receives. The current limiter G is connected in series with the capacitor C1.

The feedback circuit is arranged for controlling the charging of said capacitor C1 by said current limiter G, and thereby controlling the LED voltage provided to said at least one LED, by regulating a minimum residual headroom voltage present on an LED current limiter coupled in series with said at least one LED.

In this particular scenario, the feedback circuit comprises a comparator block as well as a minimum voltage detector block, both of which are explained in more detail here below.

The minimum voltage detector block is used for providing an output based on a potential difference between two input terminals of said second minimum voltage detector block, wherein a first of said two input terminals is set to a predefined minimum voltage, and wherein a second of said two input terminals is connected to said LED current limiter coupled in series with said at least one LED, wherein said output of said minimum voltage detector block is connected to said second of said two input terminals of said comparator block.

The minimum voltage detector block may be implemented using an OpAmp U2. Here, the capacitor C4 may be charged to the minimum voltage across the LED current limiter B1, i.e. the minimum residual headroom voltage. A first terminal is connected to the capacitor C4, i.e. the minimum voltage across the LED current limiter B1 and the other, i.e. second, terminal is connected to the LED current limiter. It is noted that the residual headroom voltage is present on the LED current limiter. As such, the OpAmp U2 is used for detecting the minimum voltage across the LED current limiter B1.

The output of the minimum voltage detector block is provided to the comparator block.

The comparator block may be arranged for providing an output based on a potential difference between two input terminals of said comparator block, wherein a first of said two input terminals is set to a predefined minimum residual headroom voltage, and wherein a second of said two input terminals is arranged for receiving a minimum value of said residual headroom voltage present on said LED current limiter coupled in series with said at least one LED, and wherein an output of said comparator block is used for controlling said current limiter.

The comparator block may be implemented using an OpAmp U1. Here, the output of OpAmp U2 is connected to the second of the two input terminal of the OpAmp U1. The OpAmp U1 may also be considered as a noise amplifier. The output of the OpAmp U1 is used as a control input for controlling the charge current of the current limiter G, which charge current may be proportional to the output voltage of the OpAmp U1.

FIG. 4 discloses a graph illustrating the minimum residual headroom voltage using an LED driver in accordance with the present disclosure.

The graph 310 may be compared to the graph shown in FIG. 2, i.e. as indicated with reference numeral 200.

The same conditions apply in both cases, i.e. the same AC mains supply voltage and the same forward voltage of the at least one LED.

Difference is that the graph having reference numeral 310 is based on the LED driver in accordance with the present disclosure, while the graph having reference numeral 200 is based on the LED driver in accordance with the prior art.

In FIG. 4, line indicated with reference numeral 312 is the voltage provided by the capacitor C1 and the line indicated with reference numeral 311 is the charging current provided by the current limiter G.

Here, it is shown that the charging current deviates from the charging current as shown in FIG. 2.

Such a deviation in charging current leads to a difference in the minimum headroom voltage present on the LED current limiter. That is, the line having reference numeral 312 drops to about 272V instead of about 282V as shown in FIG. 10. In essence, the minimum headroom voltage is reduced by about 10V in this particular case.

The presented LED driver is beneficial for multiple reasons. One of the reasons is that the LED driver reduces the overall losses occurring in the LED current limiter by reducing the minimum headroom voltage that is present over the LED current limiter. The presented LED driver accomplishes this by tuning, regulating, or controlling the charge current of C1 based on the minimum headroom voltage over the LED current limiter.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope thereof.

The invention claimed is:

1. A Light Emitting Diode, LED, driver arranged for driving at least one LED, said LED driver comprising:
   a rectifier arranged for receiving an Alternating Current, AC, supply voltage and for providing an output Direct Current, DC, voltage to said at least one LED;
   a voltage regulating branch arranged for controlling an LED voltage provided to said at least one LED, via a supply line, wherein said voltage regulating branch is arranged for receiving said DC voltage from said rectifier, wherein said voltage regulating branch comprises:
      a capacitor arranged for providing said LED voltage to said at least one LED;
      a current limiter, connected in series with said capacitor, and arranged for charging said capacitor thereby providing said LED voltage;
   an LED current limiter, connected in series with said at least one LED, such that a residual headroom voltage is present over said LED current limiter; and
   a feedback circuit comprising a comparator block arranged for providing an output based on a potential difference between two input terminals of said comparator block, wherein a first of said two input terminals is set to a predefined residual headroom voltage, and wherein a second of said two input terminals is arranged for receiving a value of said residual headroom voltage present on the LED current limiter, and wherein an output of said comparator block is used for controlling said current limiter, wherein the feedback circuit is arranged for controlling the charging of said capacitor by said current limiter, and thereby controlling the LED voltage provided to said at least one LED, by regulating the residual headroom voltage present on the LED current limiter.

2. The LED driver in accordance with claim 1, wherein said feedback circuit further comprises:

a minimum voltage detector block, for providing an output based on a potential difference between two input terminals of said minimum voltage detector block, wherein a first of said two input terminals is set to a predefined minimum voltage, and wherein a second of said two input terminals is connected to said LED current limiter, wherein said output of said minimum voltage detector block is connected to said second of said two input terminals of said comparator block.

3. The LED driver in accordance with claim 2, wherein said predefined minimum residual headroom voltage is approximately 1 Volt.

4. A Light Emitting Diode, LED, based lighting device comprising:

at least one LED for emitting light;

a light emitting diode, LED, driver arranged for driving the at least one LED, said LED driver comprising:

a rectifier arranged for receiving an Alternating Current, AC, supply voltage and for providing an output Direct Current, DC, voltage to said at least one LED;

a voltage regulating branch arranged for controlling an LED voltage provided to said at least one LED, via a supply line, wherein said voltage regulating branch is arranged for receiving said DC voltage from said rectifier, wherein said voltage regulating branch comprises:

a capacitor arranged for providing said LED voltage to said at least one LED;

a current limiter, connected in series with said capacitor, and arranged for charging said capacitor thereby providing said LED voltage;

an LED current limiter, connected in series with said at least one LED, such that a residual headroom voltage is present over said LED current limiter; and a feedback circuit comprising a comparator block arranged for providing an output based on a potential difference between two input terminals of said comparator block, wherein a first of said two input terminals is set to a predefined residual headroom voltage, and wherein a second of said two input terminals is arranged for receiving a value of said residual headroom voltage present on the LED current limiter, and wherein an output of said comparator block is used for controlling said current limiter, wherein the feedback circuit is arranged for controlling the charging of said capacitor by said current limiter, and thereby controlling the LED voltage provided to said at least one LED, by regulating the residual headroom voltage present on the LED current limiter.

5. A method of operating a light emitting diode, LED, driver arranged for driving at least one LED, said LED driver comprising:

a rectifier arranged for receiving an Alternating Current, AC, supply voltage and for providing an output Direct Current, DC, voltage to said at least one LED;

a voltage regulating branch arranged for controlling an LED voltage provided to said at least one LED, via a supply line, wherein said voltage regulating branch is arranged for receiving said DC voltage from said rectifier, wherein said voltage regulating branch comprises:

a capacitor arranged for providing said LED voltage to said at least one LED;

a current limiter, connected in series with said capacitor, and arranged for charging said capacitor thereby providing said LED voltage;

an LED current limiter, connected in series with said at least one LED, such that a residual headroom voltage is present over said LED current limiter; and a feedback circuit comprising a comparator block arranged for providing an output based on a potential difference between two input terminals of said comparator block, wherein a first of said two input terminals is set to a predefined residual headroom voltage, and wherein a second of said two input terminals is arranged for receiving a value of said residual headroom voltage present on the LED current limiter, and wherein an output of said comparator block is used for controlling said current limiter, wherein the feedback circuit is arranged for controlling the charging of said capacitor by said current limiter, and thereby controlling the LED voltage provided to said at least one LED, by regulating the residual headroom voltage present on the LED current limiter, wherein said method comprises:

controlling, by said voltage regulating branch, the LED voltage provided to said at least one LED by regulating the residual headroom voltage present on the LED current limiter coupled in series with said at least one LED; and controlling, by said feedback circuit, the current limiter based on an amplified difference between the residual headroom voltage present on the LED current limiter and the predefined residual headroom voltage.

6. The method in accordance with claim 5, further comprises:

regulating, by said voltage regulating branch, the LED voltage provided to said at least one LED by stabilizing the residual headroom voltage to a predefined minimum residual headroom voltage.

7. The method in accordance with claim 6, wherein the predefined minimum residual headroom voltage is approximately 1 Volt.

* * * * *